United States Patent [19]

Davis

[11] Patent Number: 5,670,240
[45] Date of Patent: Sep. 23, 1997

[54] EMBOSSED SUBSTRATE AND PHOTORECEPTOR DEVICE INCORPORATING THE SAME AND METHOD

[75] Inventor: Gregory F. Davis, Guerneville, Calif.

[73] Assignee: Flex Products, Inc., Santa Rosa, Calif.

[21] Appl. No.: 555,530

[22] Filed: Nov. 9, 1995

[51] Int. Cl.$^6$ ........................................ B32B 3/00
[52] U.S. Cl. .......................... 428/195; 428/141; 428/174; 428/179; 428/411.1; 428/457; 428/458; 428/480; 428/500
[58] Field of Search ........................ 428/195, 411.1, 428/192, 212, 245, 500, 524, 141, 174, 179, 457, 458, 480

[56] References Cited

U.S. PATENT DOCUMENTS

| | | |
|---|---|---|
| 4,671,913 | 6/1987 | Gen et al. .................... 264/171 |
| 5,155,604 | 10/1992 | Miella et al. ................ 359/2 |
| 5,164,227 | 11/1992 | Miekka et al. ............... 427/162 |
| 5,425,977 | 6/1995 | Hopfe ........................... 428/141 |

*Primary Examiner*—William Krynski
*Attorney, Agent, or Firm*—Flehr Hohbach Test Albritton & Herbert LLP

[57] ABSTRACT

An embossed substrate comprising a substrate of a plastic material and having a surface and an embossed surface carried by the surface of the substrate. The embossed surface is characterized by having a pattern with an average roughness of between 100 nanometers and 300 nanometers with the roughness being distributed substantially uniformly over the surface, the pattern has ridges and valleys with the horizontal distance between adjacent ridges and/or valleys being greater than the depth between the ridges and the valleys. The peaks and the valleys are randomly disposed without periodicity to cause diffusion of light impinging thereon to minimize or eliminate interface effects when the embossed surface overcoated with thin planar organic layers is exposed to light.

9 Claims, 2 Drawing Sheets

EMBOSSED SUBSTRATE AND PHOTORECEPTOR DEVICE INCORPORATING THE SAME AND METHOD

This invention relates to an embossed substrate and photoreceptor device incorporating the same and method of manufacture.

In photoreceptor belts utilized in copiers, various thin layers have been utilized in the manufacture of such belts. In order to increase the sensitivity of those belts, it has been found to be desirable to make the thin layers forming those belts still thinner and more planar. As these layers have been made thinner or more planar, it has been found that optical interference (moire effects) occurs within the thin planarized overcoating. In other words, the moire effects provide color or wood grain effects which are particularly undesirable in laser printers because they create constructive and/or destructive interference which interferes with the images being printed. There is therefore a need for a photoreceptor substrate which minimizes or eliminates such optical interference and a method of manufacture which makes possible the manufacture of such a photoreceptor substrate.

In general, it is an object of the present invention to provide an embossed substrate and photoreceptor device incorporating the same and a method of manufacture which minimizes or eliminates such optical interference effects.

Another object of the invention is to provide a substrate, device and method of the above character in which a surface is provided having a pattern which has a random surface topography without periodicity that eliminates optical interference effects.

Another object of the invention is to provide a substrate, device and method of the above character in which the roughness of the embossed surface is controlled within predetermined limits.

Another object of the invention is to provide a substrate, device and method of the above character in which the roughness has an average roughness ranging from 100 to 300 nanometers.

Another object of the invention is to provide a substrate, device and method which can be used with laser wavelengths ranging from 350 to 1050 nanometers.

Another object of the invention is to provide a substrate, device and method of the above character in which the pattern has peaks and valleys and in which the distance between the adjacent peaks and/or valleys is greater than the depth from the top of a peak and the bottom of an adjacent valley.

Another object of the invention is to provide the substrate, device and method which is suitable for use with mass production techniques.

Another object of the invention is to provide a substrate, device and method which can be utilized for producing photoreceptor belts.

Additional objects and features of the invention will appear from the following description in which the preferred embodiments are set forth in conjunction with the accompanying drawings.

In general, the embossed substrate of the present invention is comprised of a substrate having an embossed surface. The embossed surface is characterized in that it has a pattern with an average roughness of between 100 nanometers and 300 nanometers with the roughness being distributed substantially uniformly over the pattern. The pattern has ridges and valleys with the distance between adjacent ridges being greater than the depth between adjacent peaks and valleys. The peaks and valleys are randomly disposed without periodicity in the pattern to diffuse light impinging thereon to minimize or eliminate interference effects when the substrate is overcoated with a planar film and exposed to light.

Figure 1:
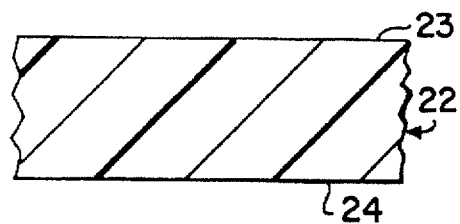
FIG. 1 is a cross-sectional view of a typical substrate used in connection with the present invention.
Figure 2:
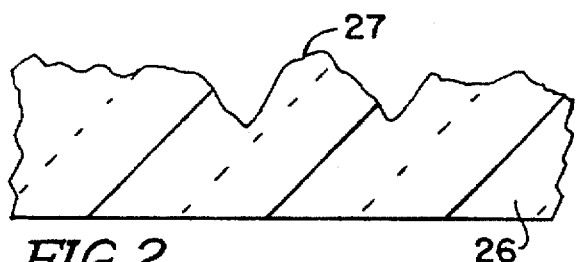
FIG. 2 is a cross-sectional view of etched glass the surface of which is to be replicated in a method of the present invention.
Figure 9:
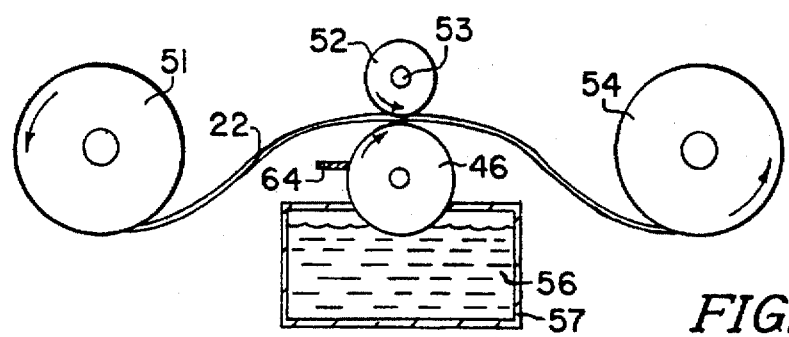
FIG. 9 is a schematic diagram showing apparatus depicting the manner in which the pattern carried by the metal shims on the embossing roller shown in FIG. 8 are transferred to provide an embossed film.
Figure 10:
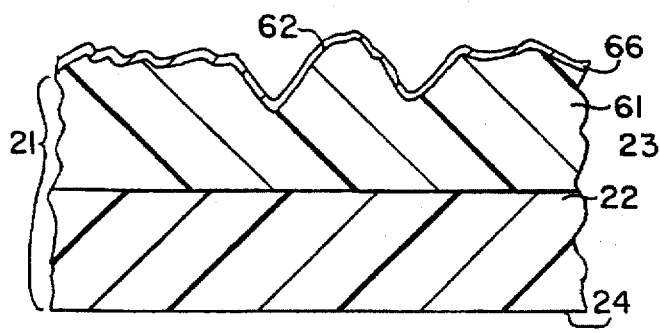
FIG. 10 is a cross-sectional view showing the embossed film produced in FIG. 9 adhered to the substrate shown in FIG. 1 with the vacuum-deposited ground plane on top of the embossed film.

More in particular as shown in FIG. 1 through 11 of the drawings, an embossed substrate 21 incorporating the present invention is shown in FIG. 10 and is made utilizing a substrate 22 shown in FIG. 1 in conjunction with the steps shown in FIGS. 2 through 9. The substrate 19 has upper and lower surfaces 23 and 24. The substrate 22 preferably is formed of a flexible material as for example a plastic such as PET having a thickness ranging from 1 to 10 mils and preferably a thickness of 2–3 mils and in which the surfaces 23 and 24 do not have the desired roughness necessary for implementation of the present invention. Thus, for example, the surface 23 can have an average roughness $R_a$ of 78 nanometers or less which is too smooth and conversely if the surface 23 has an average roughness $R_a$ of 400 nanometers it is too rough. In accordance with the present invention it is desirable to provide a surface having an average roughness $R_a$ ranging from 100 to 300 nanometers and preferably from 120 to 250 nanometers.

As hereinafter described, one of the surfaces 23 and 24 can be directly embossed to provide the desired roughness. When this approach is utilized, it is desirable that the substrate 22 be provided with a hard coat on the surface 23 formed of a suitable material such as an acrylic. Such a starting substrate is available commercially and can be identified as TEKRA, a PET substrate with an embossable acrylic hardcoat. Marnot II supplied by TEKRA.

In the method hereinafter described for producing the embossed substrate 21, a substrate 22 without such a hard coat is utilized. In accordance with the present invention in order to find a pattern which can be embossed onto the substrate 22, various surfaces were investigated for copying or replicating to provide such an embossed surface. One article found which exhibited a desired pattern was found in a piece of glass 26 which had an etched surface 27 identified as a 90° gloss etched glass. In connection with the present invention it is believed that a gloss ranging from 60° to 97° gloss can be utilized although a 90 gloss is preferable. The surface topography 27 of such a glass can be characterized in a number of ways as set forth below wherein the replication of the surface of the glass is discussed. Typically the 90° gloss etched glass has a pattern with an average surface roughness $R_a$ of approximately 150 nanometers with a range of between 110 and 150 nanometers occurring in such an etched glass surface. RMS averages of 140 and 200 nanometers and Z averages of 430 and 410 nanometers for the depth were measured. A scan profile of the scan profile sample etched surface of the etched glass shown in FIG. 2 extended over 400 micrometers. The distance between adjacent valleys and/or peaks was approximately 10 micrometers with the depth from the top of a peak to the bottom of a valley being approximately 400 nanometers. thus it can be seen that the width between adjacent valleys and/or peaks should be greater than and preferably substantially greater as for example a factor of 20 or more than the depth between a peak and an adjacent valley. The pattern provided by the surface of such 90° gloss etched glass was random without periodicity in a miroscale.

Although glass has been utilized for providing the desired surface characteristics for embossing as hereinafter described, other materials also can provide the desired surface characteristics as, for example, plastic and metal sheets.

It should be appreciated that rather than copying or replicating a pattern which is provided by a surface of a physical article, a similar pattern can be produced by the use of a computer to provide a similar surface topography such as the form of a three-dimensional damped sinusoidal wave where the high amplitude peaks are randomly spaced across the surface. By way of example, the width or spacing between adjacent peaks could be approximately 10 microns whereas the depth from the top of a peak to the bottom of a valley could be approximately 0.1 micron. The damping is required to prevent the formation of a diffraction grating. In other words the pattern formed should be diffuse and random to avoid periodicity on the surface and also to avoid diffraction effects.

Figure 3:
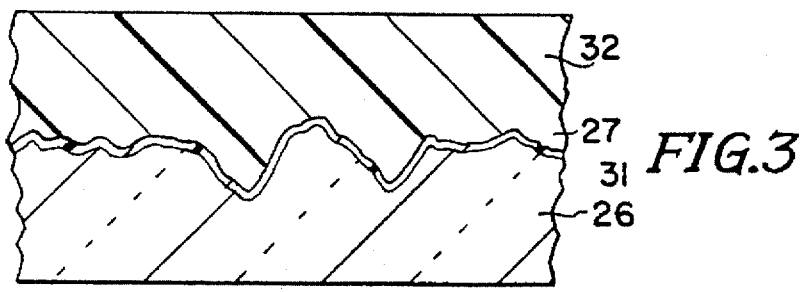
FIG. 3 is a cross-sectional view showing the etched glass in FIG. 2 being overcoated with a layer of photoresist to provide a negative of the surface of the etched glass shown in FIG. 2.

Assuming that the desired surface has been chosen which it is desired to replicate in accordance with the present invention, the glass substrate 26 shown in FIG. 3 has the surface 27 coated with a release film 31 formed of a suitable material such as silicone oil to a thickness of approximately 0.1 micron or less. A photoresist layer 32 is deposited over the release film 31 in a suitable manner such as by supplying a liquid negative photoresist in the form of a photopolymer as for example, an Eastman Kodak photoresist and spinning it onto the surface of the release film 31 and drying the same in a conventional manner.

Figure 4:
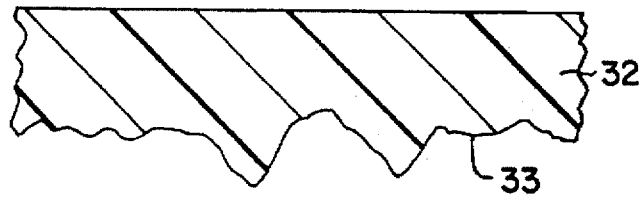
FIG. 4 is a cross-sectional view showing the photoresist layer after it has been removed from the surface of the etched glass.
Figure 5:
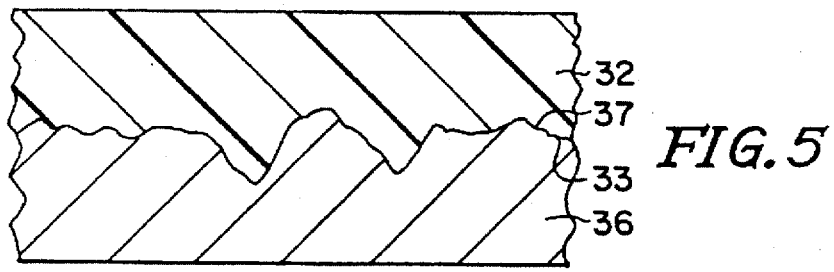
FIG. 5 is a cross-sectional view showing a positive of the surface of the etched glass formed in a gold film using the photoresist negative shown in FIG. 4.
Figure 6:
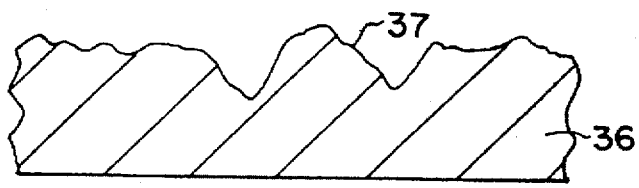
FIG. 6 is a cross-sectional view showing the gold film master which was created in the step shown in FIG. 5.
Figure 7:
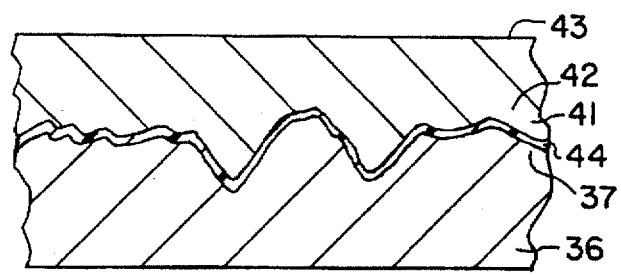
FIG. 7 is a cross-sectional view showing the manner in which a metal shim is made utilizing the gold film master to provide a shim having a negative image of the surface of the etched glass shown in FIG. 2.
Figure 8:
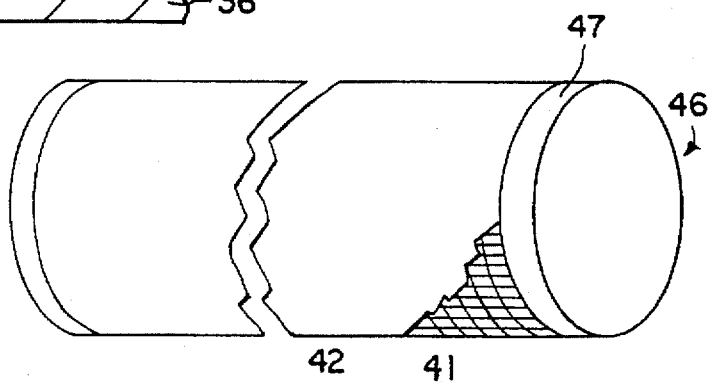
FIG. 8 is an isometric view showing an embossing roller having a matted circumferential surface covered with a plurality of metal shims of the type made in the step shown in FIG. 7.

After the photoresist layer 32 has dried or cured, the photoresist layer 32 is stripped from the surface 27 of the etched glass substrate 26 to provide a negative replica of the surface 27 of the etched glass 26 as shown in FIG. 4. In the event that the desired embossed surfaces is created by a computer, the photoresist master 32 may be created using e-beam lithography techniques utilizing the computer generated pattern. The photoresist layer 32 has a surface 33 which is a negative of the surface 27 which is desired to replicate. This surface is utilized to provide a positive replica master shim 36 having a surface 37 which creates a positive replication of the etched surface 27 of the glass substrate 26. Conversely, if desired, a negative replica master shim can be provided which creates a negative replication of an etched surface. This shim 36 can be formed of a suitable material such as gold in a conventional electroless plating method to provide a gold master shim 36 having a surface 37 which is a positive replication of the surface 27 of the glass substrate 26. As soon as the gold film master 36 has been formed, the photoresist layer 32 can be dissolved or washed away in a conventional manner so that there remains a gold film master shim 36 having the surface 37 as shown in FIG. 6. By way of example, the shim 36 can be of a suitable size as for example ½" by ½" square.

A plurality of tiling shims 41 are then formed from the gold film master shim 36 to provide surfaces 42 on the shims 41 which are the negatives of the surface 27 of the glass substrate 26 and a surface 43. To accomplish this, a release layer 44 formed of a suitable material such as a silicone oil or sodium chloride is placed on the surface 37 of the master shim 36 and thereafter a metal such as nickel is electroplated in an electroless plating technique onto the surface 37 to a suitable thickness as for example 10 microns. After the plating has been finished, the release layer 44 is dissolved sot here remains the surface 42 which carries the second negative image of the etched surface 27 of the glass 26. The nickel shims can have suitable dimensions as for example the same ½" by ½" dimensions as the gold film master shim 36.

It should be appreciated that in connection with the present invention it has been found that it is possible to utilize a negative replication of the surface. In order to create a negative replication of the surface, it is only necessary to make one more generation of the embossing shims, shifting the tiling shims from negative to positive.

In accordance with the present invention let it be assumed that it is desired to tile an embossing roller 46 having a cylindrical surface 47. The roller 46 can be formed of a suitable material such as stainless steel or aluminum. For example, utilizing a cylindrical surface having a diameter of 6" inches and a width of 36" and utilizing tiling shims ½" square, in excess of 2000 shims would be required to cover that surface. The nickel tiling shims would then be taken and have their surfaces 43 secured to the cylindrical surface 47 by adhering the surfaces 43 to the cylindrical surface 47 by a suitable means such as an adhesive (not shown) and placing the shims 46 side by side and end to end in a matte to provide a surface pattern corresponding to the surfaces 42 of the shims 41 facing outwardly and radially from the cylindrical surface 47 to provide a cylindrical embossing surface. After the shims 41 have been tiled in a matte format onto the surface 47, the roller 46 can be used to directly emboss the pattern carried thereby onto the hard coated surface of a flexible substrate as for example the PET substrate carrying an acrylic hard coat. This can be accomplished by use of a suitable temperature and pressure as for example a temperature of 150° C. and 80 pounds per square inch and running the substrate between the embossing cylinder and a smooth steel roller.

Alternatively, the embossing roller or cylinder 46 can be utilized in an apparatus and system such as shown in FIG. 9. The PET substrate 22 is carried on a supply reel 51 and travels between the embossing roller 46 and a glass roller 52 that has an ultraviolet light source 53 therein and is then taken up by a take up reel 54. As also shown in FIG. 9, the embossing roller 46 travels through a liquid in the form of an ultraviolet (UV) curable polymer bath 56 disposed within an open top tank 57. The curable polymer bath can be in the form of a UV curable acrylic polymer or an epoxy based polymer within a fast cure heat curable polymer system using an IR heat source. During operation of the apparatus shown in FIG. 9, the embossing roller 46 picks up a thin layer of the ultraviolet curable polymer from the bath 56 and engages the other under side or lower surface 24 of the substrate 22 and squeezes the polymer from the bath into the pattern on the shims 41 carried by the embossing roller 46. A doctor blade 64 can be utilized to remove excess polymer from the embossing roller before the polymer arrives at the underside of the flexible substrate 22. The polymer in contact with the embossing roller 46 is cured by the UV light source 53 to provide a cast embossed film 61 adherent to the surface 24 of the substrate 22 and to cause the layer 61 to be formed of a suitable thickness as for example 2 microns and to separate from the embossing roller 46 as it continues to rotate. The cured polymer layer 61 then travels with the substrate 22 as an embossed substrate 21 onto the take-up reel 54. After completion of the operation shown in FIG. 9, the take up reel 54 can be shipped to the customer where it can be utilized for making photoreceptor devices of the type hereinbefore described. The layer 61 provides an embossed surface 62 for the substrate 22 which is a positive or negative of the pattern provided by the etched surface 27 of the glass substrate 26 which it was desired to replicate.

Alternatively before shipping the reel 54 to the customer, the surface 62 can be provided with a vacuum deposited ground plane 66 formed of a suitable material such as metal. This can be readily accomplished by passing the embossed substrate 21 carried by the take up reel 54 and advancing the same through a conventional vacuum chamber to metallize the surface 62 to provide a conformal coating serving as the ground plane by evaporating aluminum or other suitable metallic material inside the vacuum chamber. After the metallized ground plane 66 has been provided on this surface 62, the embossed and metallized substrate can then be wound up on another take-up reel (not shown) and thereafter shipped to the customer for fabrication into photoreceptor devices.

Figure 11:
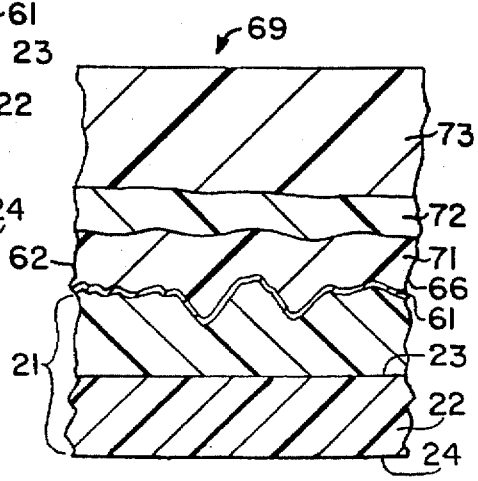
FIG. 11 is a cross-sectional view of a photoreceptor device incorporating the embossed substrate shown in FIG. 10.

The embossed substrate 21 with or without the vacuum deposited ground plane 66 can be utilized for making photoreceptor devices as for example the device 69 shown in FIG. 11. As shown therein, the embossed surface 62 was provided with the ground plane 66 as hereinbefore described followed by a series of organic coatings of a type well known to those skilled in the art. Thus there can be provided a subbing adhesion layer/charge blocking layer 71 overlying the ground plane 66. This is followed by a charge generation layer 72 and a charge transport layer 73 to provide the finished product 69. By way of example, the PET substrate 22 can have a suitable thickness as for example 75 microns. The cast embossed film or layer can have a suitable thickness as for example 2 microns. The ground plane can have a thickness of less than 0.1 microns. Typically the subbing adhesion layer or/charge blocking layer 71 can have a thickness greater than 1 micron and the charge generation layer 72 can have a thickness ranging from 0.1 to 1 micron and the charge transport layer 73 can have a thickness of 20 microns.

With the construction shown in FIG. 11 the photoreceptor device 69 is provided with an embossed surface 62 which overlies the substrate 22 and provides a light diffusing capability for the photoreceptor device 69 which minimizes or eliminates optical interference (moire) effects such as color or wood graining in the image emitted through the charge transport layer 73 even though thin planar organic layers may be utilized which overlie the ground plane 66. The embossed surface 62 as described in connection with the surface 27 of the glass 26 has a topography in which the ridges and valleys provided are in a randomized non-periodic pattern and in which the ridges and valleys are more widely spaced from each other than the vertical distance between the peaks and the valleys to provide a microscale topography which diffuses light and does not have any coherent interference effects. The average roughness $R_a$ should be less than 300 nanometers and greater than 100 nanometers. With such a topography, the photoreceptor device can be utilized with laser printers typically using infrared laser diodes for a light source having a wave length ranging from 780 to 950 nanometers. Thus the present invention is particularly applicable to IR laser copiers and printers. However, the same type of photoreceptor device as described in the present invention can be utilized in white light copying machines.

Although the present invention has been described principally in connection with a flexible plastic films, it should be appreciated that the same principles can be utilized in connection with flat surfaces such as those provided on flat plastic plates. From the foregoing it can be seen that there has been provided an embossed substrate which can be utilized in photoreceptor devices to minimize or eliminate optical interference effects when the layers making up the photoreceptor device are made thinner and more planar.

What is claimed is:

1. An embossed substrate comprising a substrate of a plastic material and having an embossed surface carried by the substrate, the embossed surface being characterized by having a pattern with an average roughness of between 100 nanometers and 300 nanometers with the roughness being distributed substantially uniformly over the surface, said pattern having ridges and valleys with the distance between adjacent ridges and/or valleys being greater than the depth between the peaks and the valleys, the peaks and the valleys being randomly disposed without periodicity to cause diffusion of light impinging thereon to minimize or eliminate interference effects when the embossed surface is exposed to light.

2. A substrate as in claim 1 wherein the substrate has a surface and wherein the embossed surface is the surface of the substrate.

3. A device as in claim 2 further including a hard coat on said surface of the substrate.

4. A device as in claim 3 wherein said substrate is PET and wherein said hard coat is an arcylic.

5. A substrate as in claim 1 further including a separate layer of plastic having first and second surfaces, said first surface of said layer being adhered to said surface of the substrate and wherein said embossed surface is formed in said second surface of said layer.

6. A substrate as in claim 5 wherein said layer is formed of an ultraviolet curable polymer.

7. A substrate in claim 6 wherein said substrate is formed of PET.

8. A substrate as in claim 7 further including a vacuum-deposited metal formed on the embossed surface.

9. A substrate as in claim 1 having the conformation of a shim.

* * * * *